US011515869B2

(12) United States Patent
Sato

(10) Patent No.: US 11,515,869 B2
(45) Date of Patent: Nov. 29, 2022

(54) SEMICONDUCTOR DEVICE

(71) Applicant: FUJI ELECTRIC CO., LTD., Kawasaki (JP)

(72) Inventor: Kenichiro Sato, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 57 days.

(21) Appl. No.: 17/236,488

(22) Filed: Apr. 21, 2021

(65) Prior Publication Data
US 2021/0384898 A1    Dec. 9, 2021

(30) Foreign Application Priority Data
Jun. 4, 2020   (JP) ............................. JP2020-097980

(51) Int. Cl.
| H02H 7/00 | (2006.01) |
| H03K 17/082 | (2006.01) |
| H02H 1/00 | (2006.01) |
| H02H 7/20 | (2006.01) |
| H03K 17/08 | (2006.01) |

(52) U.S. Cl.
CPC ....... *H03K 17/0828* (2013.01); *H02H 1/0007* (2013.01); *H02H 7/205* (2013.01); *H03K 2017/0806* (2013.01)

(58) Field of Classification Search
None
See application file for complete search history.

(56) References Cited

U.S. PATENT DOCUMENTS

| 6,459,380 B1 | 10/2002 | Watanabe et al. |
| 7,777,370 B2 * | 8/2010 | Kojori ................ H03K 17/0406 307/127 |
| 2012/0146782 A1 | 6/2012 | Komatsu et al. |
| 2017/0019092 A1 | 1/2017 | Taoka |
| 2019/0304867 A1 | 10/2019 | Higashi |

FOREIGN PATENT DOCUMENTS

| EP | 1056205 A2 | 11/2000 |
| EP | 2466752 A2 | 6/2012 |
| JP | 2000-341960 A | 12/2000 |
| JP | 2012-143125 A | 7/2012 |
| JP | 2019-186239 A | 10/2019 |
| WO | 2016/052011 A1 | 4/2016 |

* cited by examiner

*Primary Examiner* — Stephen W Jackson
(74) *Attorney, Agent, or Firm* — Rabin & Berdo, P.C.

(57) ABSTRACT

A semiconductor device, including a control circuit that has a gate control circuit driving a power semiconductor element. The control circuit further includes a plurality of alarm detection circuits respectively detecting a plurality of abnormalities, a protection circuit stopping the gate control circuit responsive to the detection of any abnormality, an alarm signal generation circuit generating an alarm signal responsive to the detected abnormality, a warning detection circuit detecting a warning before any of the abnormalities is detected, and a pulse generation circuit generating a warning signal while the warning is being detected. The alarm signal is a one-shot pulse having a pulse width thereof corresponding to the detected abnormality, such that alarm signals generated responsive to different abnormalities have different pulse widths. The warning signal includes a plurality of successive pulses, each of which has a pulse width smaller than any of the pulse widths of the alarm signals.

5 Claims, 13 Drawing Sheets

SEMICONDUCTOR DEVICE

CROSS-REFERENCE TO RELATED APPLICATION

This application is based upon and claims the benefit of priority of the prior Japanese Patent Application No. 2020-097980, filed on Jun. 4, 2020, the entire contents of which are incorporated herein by reference.

BACKGROUND OF THE INVENTION

1. Field of the Invention

The embodiments discussed herein relate to a semiconductor device.

2. Background of the Related Art

Usually a semiconductor device referred to as an intelligent power module (IPM) is used in an inverter unit applied to a variable speed unit of a motor or the like. With an IPM a power semiconductor element which performs power conversion and a control circuit which controls the power semiconductor element are brought together in one package. The control circuit includes a drive circuit which drives the power semiconductor element and protection circuits which protect the power semiconductor element. A control voltage fall detection circuit which detects a fall in the power source voltage of the control circuit, a chip temperature detection circuit which detects an overheat state of a chip of the power semiconductor element, and an overcurrent detection circuit which detects an overcurrent state of the power semiconductor element are included as the protection circuits.

Furthermore, a control circuit of an IPM has the function of outputting, before detecting an abnormality of a power semiconductor element and outputting an alarm, a warning as a sign of the alarm (see, for example, Japanese Laid-open Patent Publication No. 2000-341960).

FIG. 12 is a circuit block diagram illustrative of an example of the structure of a conventional semiconductor device. FIG. 13 is a timing chart illustrative of the overheat protection operation of the conventional semiconductor device.

A conventional semiconductor device 10 includes a power semiconductor element 20 and a control circuit 30. With the example of FIG. 12 an insulated gate bipolar transistor (IGBT) is used as the power semiconductor element 20. A power metal-oxide-semiconductor field-effect transistor (MOSFET) may be used as the power semiconductor element 20 in place of an IGBT.

The power semiconductor element 20 includes a temperature sensor 21 and a current sensor 22. The temperature sensor 21 may be a temperature detection diode formed in an IGBT chip of the power semiconductor element 20. For example, the current sensor 22 is a sense IGBT formed in the IGBT chip and a current sense resistor which converts a current outputted from the sense IGBT to a voltage.

The control circuit 30 includes a gate control circuit 31 which on-off controls a gate of the power semiconductor element 20. Furthermore, the control circuit includes a control voltage fall detection circuit 32, an overcurrent detection circuit 33, a chip temperature detection circuit 34, an alarm signal generation circuit 35, a MOSFET 36, a constant-current circuit 37, and an OR circuit 38 as an alarm detection circuit. In addition, the control circuit 30 includes a temperature warning detection circuit 39, a MOSFET 40, and a constant-current circuit 41 as a warning detection circuit.

The semiconductor device 10 has an input terminal 42 which receives a pulse-width modulation (PWM) signal from the outside, an alarm signal output terminal 43 which outputs an alarm signal to the outside, a warning signal output terminal 44 which outputs a warning signal to the outside, output terminals 45 and 46 connected to a load, and a control power source terminal 47. The input terminal 42 is connected to an input of the gate control circuit 31. An output of the gate control circuit 31 is connected to the gate of the power semiconductor element 20. A collector of the power semiconductor element 20 is connected to the output terminal 45. An emitter of the power semiconductor element 20 is connected via the current sensor 22 to the output terminal 46.

The control voltage fall detection circuit 32 includes a comparator 32a and a reference voltage source 32b. An inverting input of the comparator 32a is connected via the control power source terminal 47 to control cower source 48 and a non-inverting input of the comparator 32a is connected to the reference voltage source 32b. An output of the comparator 32a is connected to an input of the alarm signal generation circuit 35 and an input of the OR circuit 38.

The overcurrent detection circuit 33 includes a comparator 33a and a reference voltage source 33b. A non-inverting input of the comparator 33a is connected to an output of the current sensor 22 and an inverting input of the comparator 33a is connected to the reference voltage source 33b. An output of the comparator 33a is connected to the input of the alarm signal generation circuit 35 and an input of the OR circuit 38.

The chip temperature detection circuit 34 includes a comparator 34a and a reference voltage source 34b. An inverting input of the comparator 34a is connected an output of the temperature sensor 21 and a non-inverting input of the comparator 34a is connected to the reference voltage source 34b. An output of the comparator 34a is connected to input of the alarm signal generation circuit 35 and an input of the OR circuit 38. Furthermore, the chip temperature detection circuit 34 includes a power source 34c and supplies power to the temperature sensor 21.

An output of the alarm signal generation circuit 35 is connected to a gate of the MOSFET 36, a drain of the MOSFET 36 is connected to the constant-current circuit 37 and the alarm signal output terminal 43, and a source of the MOSFET 36 is connected to a ground. An output of the OR circuit 38 is connected to a drive stop signal input of the gate control circuit 31.

The temperature warning detection circuit 39 includes a comparator 39a and a reference voltage source 39b. An inverting input of the comparator 39a is connected to the output of the temperature sensor 21 and a non-inverting input of the comparator 39a is connected to the reference voltage source 39b. An output of the comparator 39a is connected to a gate of the MOSFET 40, a drain of the MOSFET 40 is connected to the constant-current circuit 41 and the warning signal output terminal 44, a source of the MOSFET 40 is connected to the ground.

The comparator 32a in the control voltage fall detection circuit 32 compares a voltage of the control power source 48 and a voltage of the reference voltage source 32b. In a normal case, the voltage of the control power source 48 is higher than the voltage of the reference voltage source 32b. Accordingly, the comparator 32a outputs a low (L)-level signal.

The comparator 33a in the overcurrent detection circuit 33 compares an output voltage of the current sensor 22 and a voltage of the reference voltage source 33b. In a normal case, the output voltage of the current sensor 22 is lower than the voltage of the reference voltage source 33b. Accordingly, the comparator 33a outputs an L-level signal.

The comparator 34a in the chip temperature detection circuit 34 compares an output voltage of the temperature sensor 21 and a voltage of the reference voltage source 34b. In a normal case, the output voltage of the temperature sensor 21 is higher than the voltage of the reference voltage source 34b. Accordingly, the comparator 34a outputs an L-level signal.

If the operation of the semiconductor device 10 is normal, then each of the control voltage fall detection circuit 32, the overcurrent detection circuit 33, and the chip temperature detection circuit 34 outputs an L-level signal in this way. As a result, the alarm signal generation circuit 35 outputs an L-level signal. Accordingly, the MOSFET 36 is in an off state and, as illustrated in FIG. 13, a voltage at the alarm signal output terminal 43 is equal to the voltage or the control power source 48 (15 volts (V) in the example of FIG. 13). At this time the OR circuit 38 also outputs an L-level drive stop signal. As a result, the gate control circuit 31 continues supply a gate signal to the power semiconductor element 20 and the semiconductor device 10 continues normal operation.

On the other hand, the comparator 39a in the temperature warning detection circuit compares the output voltage of the temperature sensor 21 and a voltage of the reference voltage source 39b. If the operation of the semiconductor device 10 is normal, then the output voltage of the temperature sensor 21 is higher than the voltage of the reference voltage source 39b. As a result, the comparator 39a outputs an L-level signal. Accordingly, the MOSFFT 40 is in an off state and a voltage at the warning signal output terminal 44 is equal to the voltage of the control power source 48 (15 V in the example of FIG. 13).

Each of the comparator 32a in the control voltage fall detection circuit 32, the comparator 33a in the overcurrent detection circuit 33, the comparator 34a in the chip temperature detection circuit 34, and the comparator 39a in the temperature warning detection circuit 39 has a hysteresis characteristic.

For example, a load becomes heavier when the operation of the semiconductor device 10 is normal. In this case, chip temperature in the power semiconductor element 20 rises. The operation of the semiconductor device 10 at this time will now be described by reference to FIG. 13.

First each of the chip temperature detection circuit 34 and the temperature warning detection circuit 39 outputs an L-level signal when chip temperature Tj in the power semiconductor element 20 is lower than a temperature warning level. Accordingly, each of the MOSFETs 36 and 40 is in an off state and a voltage at the alarm signal output terminal 43 and a voltage at the warning signal output terminal 44 are equal to the voltage of the control power source 48.

When the chip temperature Tj in the power semiconductor element 20 rises and reaches the temperature warning level, the comparator 39a in the temperature warning detection circuit 39 outputs a high (H)-level signal. As a result, the MOSFET 40 goes into an on state and a voltage at the warning signal output terminal 44 becomes 0 V. An external unit connected to the warning signal output terminal 44 detects that a voltage at the warning signal output terminal 44 falls to 0 V. By doing so, the external unit recognizes that the chip temperature Tj in the power semiconductor element 20 rises and that the chip temperature Tj in the power semiconductor element 20 reaches or become higher than the temperature warning level.

When the chip temperature Tj in the power semiconductor element 20 rises further and reaches an overheat protection level, the comparator 34a in the chip temperature detection circuit 34 outputs an H-level signal. As a result, the OR circuit 38 outputs an H-level drive stop signal to stop the operation of the gate control circuit 31. At the same time the alarm signal generation circuit 35 generates and outputs an H-level alarm signal having a pulse width corresponding to an overheat state. Because the MOSFET 36 is in an on state for an H-level alarm signal output period, a voltage at the alarm signal output terminal 43 becomes 0 V. An external unit connected to the alarm signal output terminal 43 detects that a voltage at the alarm signal output terminal 43 falls to 0 V for a period for which an alarm signal is at an H level. By doing so, the external unit recognizes that the chip temperature Tj in the power semiconductor element 20 rises and that the chip temperature in the power semiconductor element 20 reaches or become higher than the temperature warning level.

When the power semiconductor element 20 stops the operation, the chip temperature Tj gradually falls. When the chip temperature Tj falls below an overheat protection reset level, the comparator 34a in the chip temperature detection circuit 34 outputs an L-level signal. As a result, the OR circuit 38 outputs an L-level drive stop signal to resume the operation of the gate control circuit 31.

When the chip temperature Tj falls further and falls below a temperature warning reset level, the comparator 39a in the temperature warning detection circuit 39 output an L-level signal. As a result, the MOSFET 40 goes into an off state and the warning signal output terminal 44 outputs the voltage of the control power source 48.

A case where the chip temperature Tj in the power semiconductor element 20 rises and reaches or become higher than the temperature warning level has been described. If the control voltage fall detection circuit or the overcurrent detection circuit 33 detects an abnormality, then the same operation that is performed by the chip temperature detection circuit 34 is carried out. However, the alarm signal generation circuit 35 changes a pulse width of an alarm signal to be generated according to factors. In a desirable example, a pulse width of an alarm signal is as follows. When the overcurrent detection circuit 33 detects an overcurrent, a pulse width of an alarm signal is set to 2 milliseconds (ms). When the control voltage fall detection circuit 32 detects a fall in control voltage, a pulse width of an alarm signal is set to 4 ms. When the chip temperature detection circuit 34 detects an overheat, a pulse width of an alarm signal is set to 8 ms.

With the above conventional semiconductor device, however, there is need to draw a distinction between alarm generation and warning generation and separately locate output terminals for informing an external unit about them. This leads to an increase in the number of control terminals.

SUMMARY OF THE INVENTION

According to an aspect, there is provided a semiconductor device including a power semiconductor element; a control circuit including: a gate control circuit which drives the power semiconductor element, a plurality of alarm detection circuits which detect a plurality of abnormalities of the power semiconductor element, respectively, a protection circuit which stops the gate control circuit, responsive to detection of any of the abnormalities by any of the alarm detection circuits, to protect the power semiconductor element, an alarm signal generation circuit which generates an alarm signal responsive to the detection of any of the abnormalities by any of the alarm detection circuits, the alarm signal being a one-shot pulse having a pulse width thereof corresponding to the detected abnormality, such that alarm signals generated responsive to different ones of the abnormalities have different pulse widths, and a warning detection circuit which detects a warning at a timing earlier than a timing at which any of the abnormalities is detected by any of the alarm detection circuits, and a pulse generation circuit which generates a warning signal while the warning is being detected by the warning detection circuit, the warning signal including a plurality of successive pulses, each of which has a pulse width smaller than any of the pulse widths of the alarm signals; and an alarm signal output terminal which outputs a signal based on one or both of the alarm signal and the warning signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
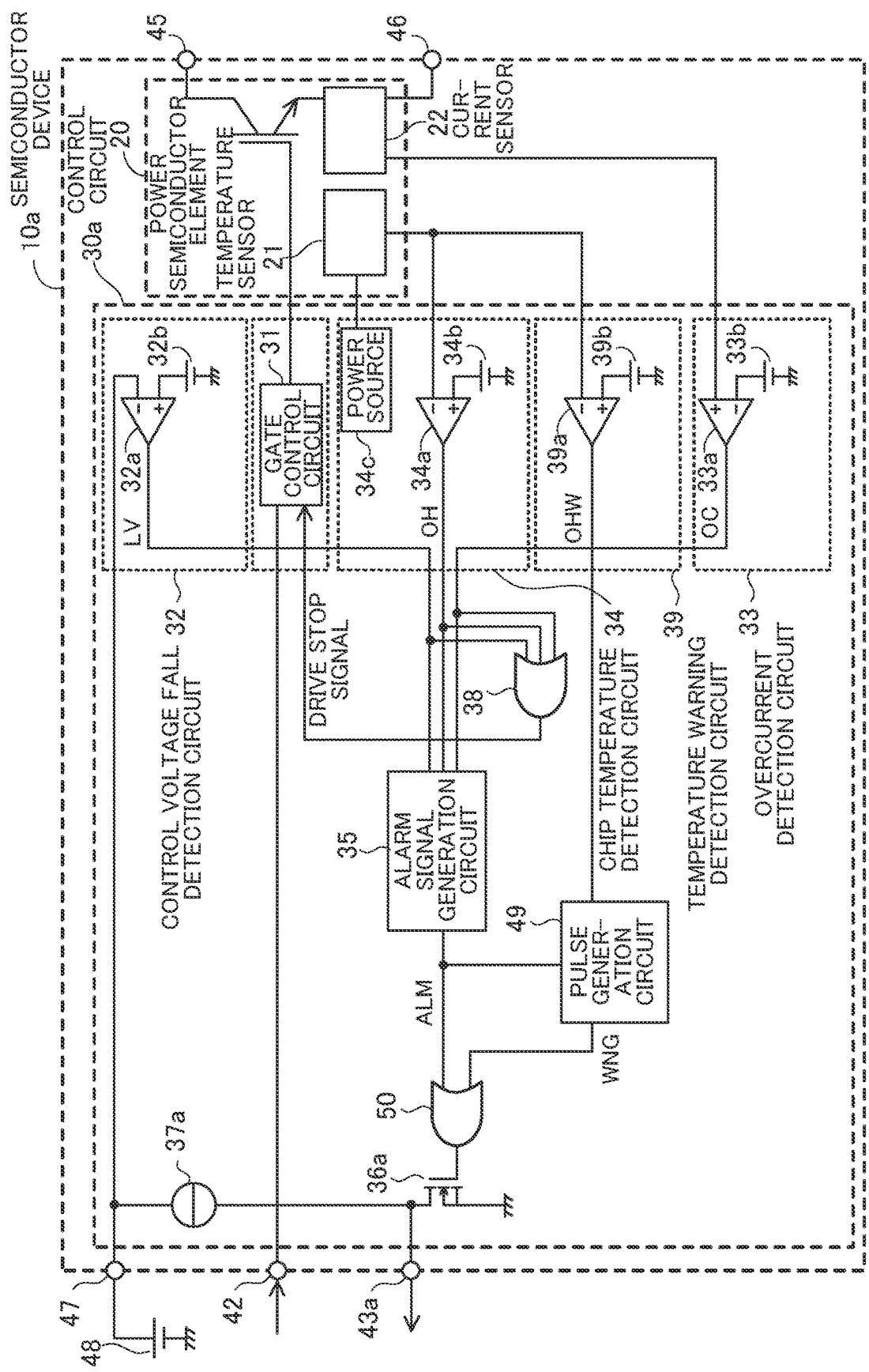
FIG. 1 is a circuit block diagram illustrative of an example of the structure of a semiconductor device according to a first embodiment.

Embodiments will now be described in detail by reference to the accompanying drawings. In the drawings, components marked with the same numerals are the same. Furthermore, more than one embodiment may partially be combined and implemented as long as there is no contradiction.

Figure 2:
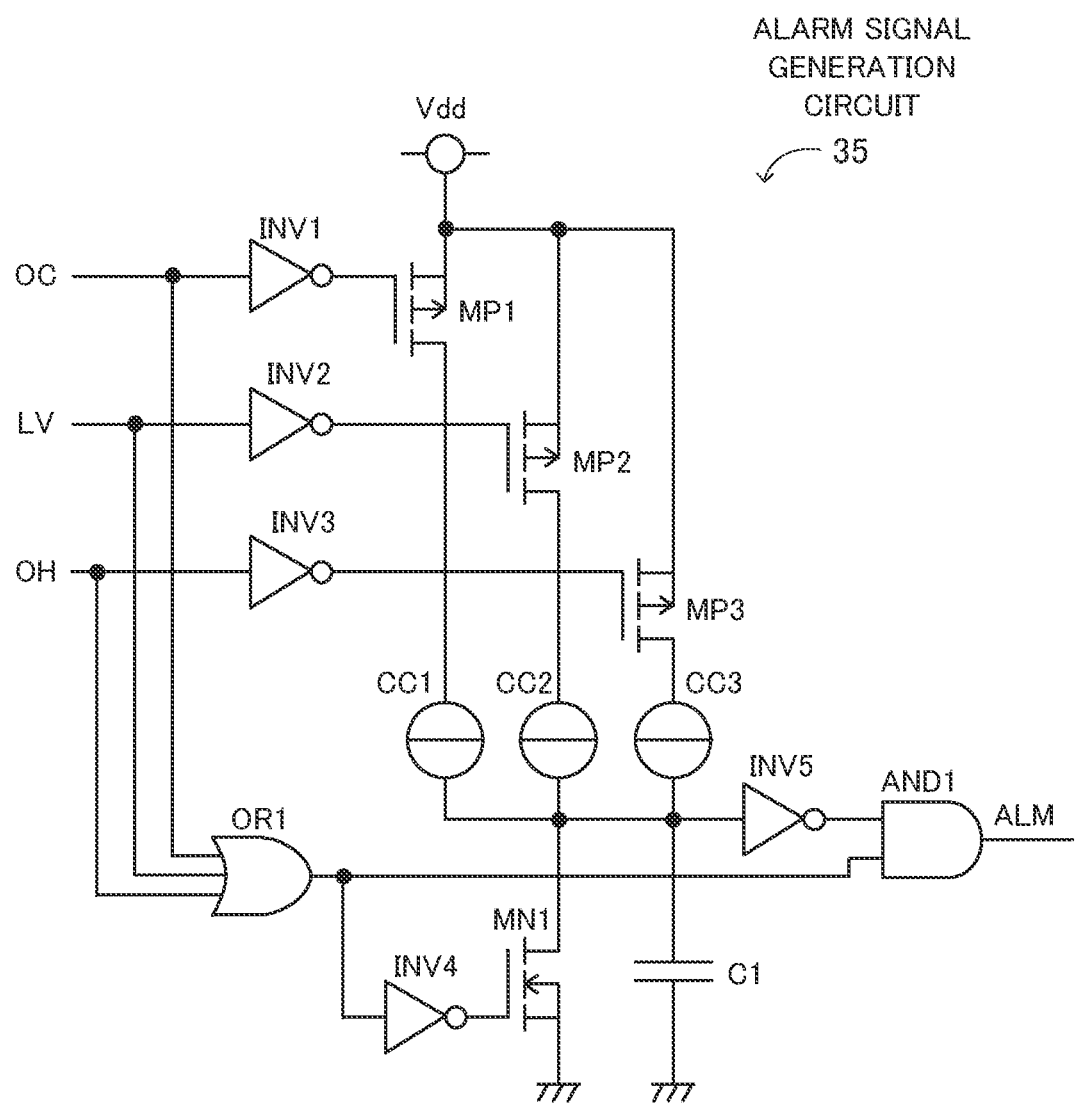
FIG. 2 is a circuit diagram illustrative of an example of the structure of an alarm signal generation circuit.
Figure 3:
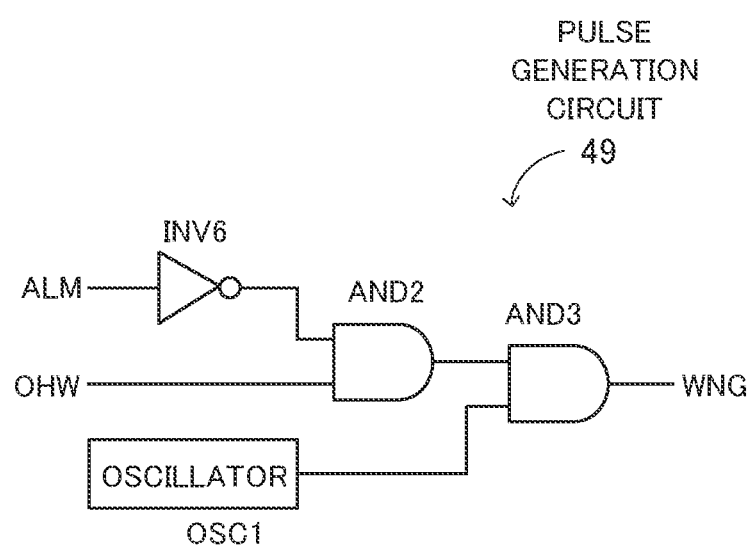
FIG. 3 is a circuit diagram illustrative of an example of the structure of a pulse generation circuit.
Figure 12:
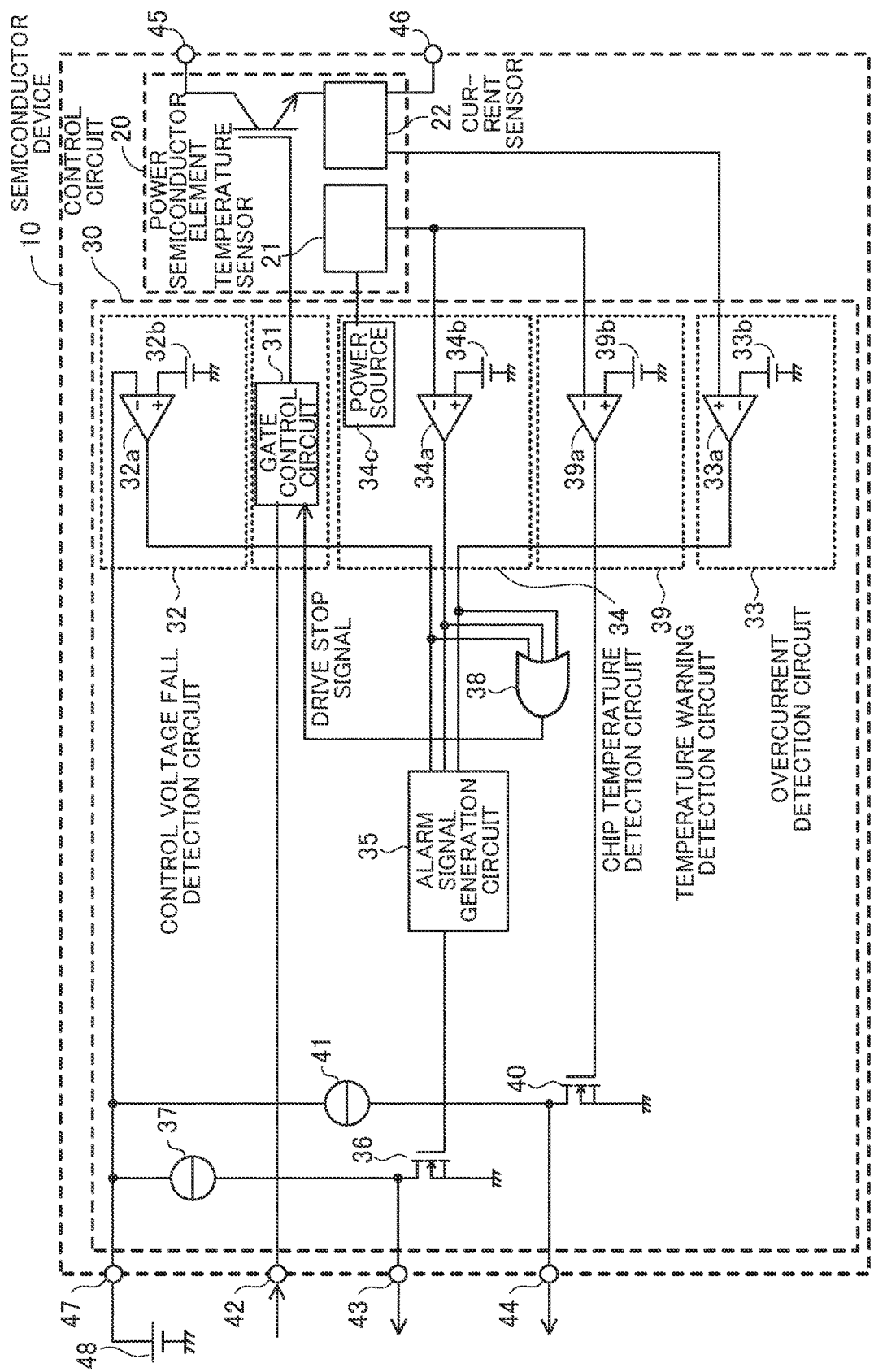
FIG. 12 is a circuit block diagram illustrative of an example of the structure of a conventional semiconductor device.
Figure 13:
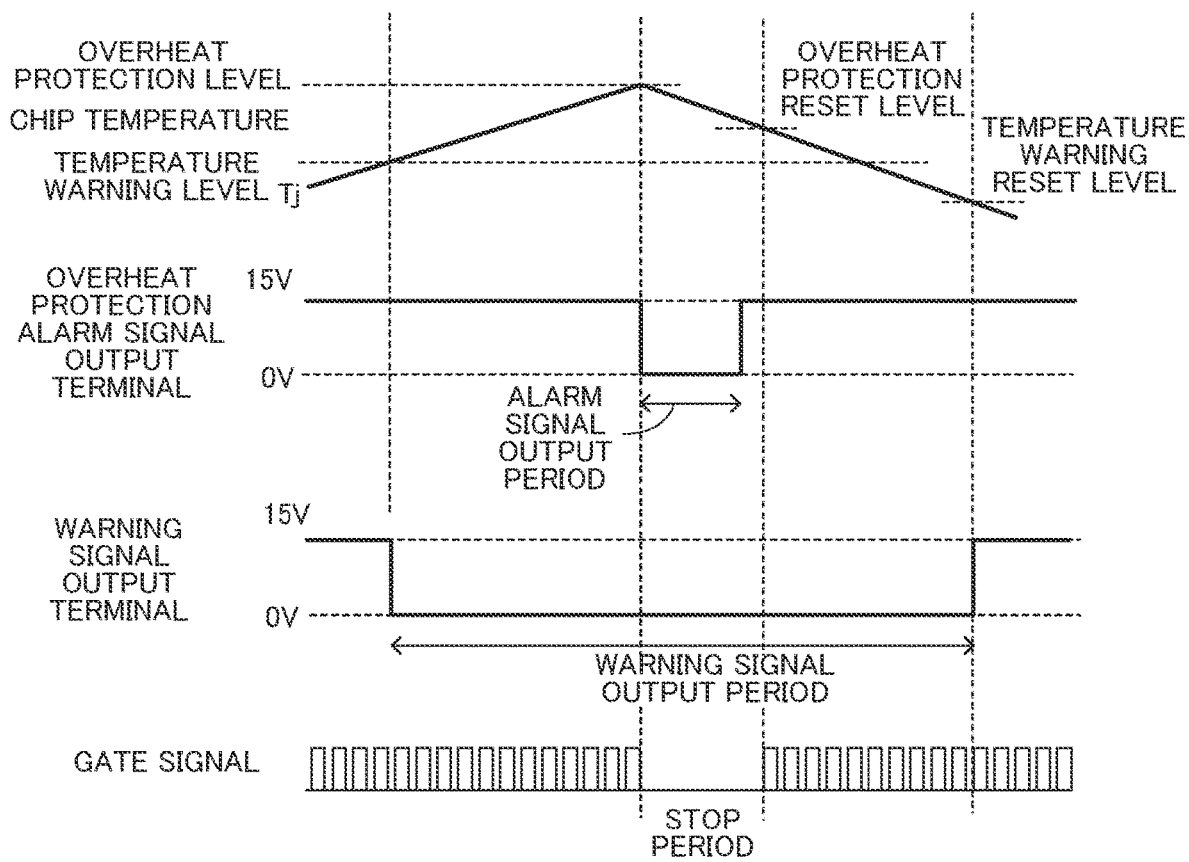
FIG. 13 is a timing chart illustrative of the overheat protection operation of the conventional semiconductor device.

FIG. 1 is a circuit block diagram illustrative of an example of the structure of a semiconductor device according to a first embodiment. FIG. 2 is a circuit diagram illustrative of an example of the structure of an alarm signal generation circuit. FIG. 3 is a circuit diagram illustrative of an example of the structure of a pulse generation circuit. Components in FIG. 1 which are the same as those illustrated in FIG. 12 are marked with the same numerals.

A semiconductor device 10a according to a first embodiment includes a cower semiconductor element 20 and a control circuit 30a. In the example of FIG. 1, an IGBT is used as the power semiconductor element 20. The power semiconductor element 20 includes a temperature sensor 21 and a current sensor 22.

The control circuit 30a includes a gate control circuit 31 which on-off controls a gate of the power semiconductor element 20. Furthermore, the control circuit 30a includes a control voltage fall detection circuit 32, an overcurrent detection circuit 33, and a chip temperature detection circuit 34 as alarm detection circuits and an alarm signal generation circuit 35. The control circuit 30a includes a temperature warning detection circuit 39 as a warning detection circuit. In addition, the control circuit 30a includes OR circuits 38 and 50, a MOSFET 36a, and a constant-current circuit 37a.

The semiconductor device 10a has an input terminal 42 which receives a signal for on-off controlling the power semiconductor element 20, an alarm signal output terminal 43a which outputs an alarm signal and a warning signal to the outside, output terminals 45 and 46 connected to a load, and a control power source terminal 47. The input terminal 42 is connected to an input of the gate control circuit 31. An output of the gate control circuit 31 is connected to the gate of the power semiconductor element 20. A collector of the power semiconductor element 20 is connected to the output terminal 45. An emitter of the power semiconductor element 20 is connected via the current sensor 22 to the output terminal 46.

The control voltage fall detection circuit 32 includes a comparator 32a and a reference voltage source 32b. An inverting input of the comparator 32a is connected via the control power source terminal 47 to a control power source 48 and a non-inverting input of the comparator 32a is connected to the reference voltage source 32b. An output of the comparator 32a is connected to an input of the alarm signal generation circuit 35 and an input of the OR circuit 38. In this embodiment, a voltage at normal time of the control power source 48 is set to 15 V and a voltage of the reference voltage source 32b is set to 11 V. Accordingly, when a voltage of the control power source 48 falls to or below 11 V, the comparator 32a outputs an H-level voltage fall detection signal LV.

The overcurrent detection circuit 33 includes a comparator 33a and a reference voltage source 33b. A non-inverting input of the comparator 33a is connected to an output of the current sensor 22 and an inverting input of the comparator 33a is connected to the reference voltage source 33b. An output of the comparator 33a is connected to the input of the alarm signal generation circuit 35 and an input of the OR circuit 38. When a collector current of the power semiconductor element 20 exceeds a current value corresponding to a voltage of the reference voltage source 33b, the comparator 33a outputs an H-level overcurrent detection signal OC.

The chip temperature detection circuit 34 includes a comparator 34a and a reference voltage source 34b. An inverting input of the comparator 34a is connected to an output of the temperature sensor 21 and a non-inverting input of the comparator 34a is connected to the reference voltage source 34b. An output of the comparator 34a is connected to an input of the alarm signal generation circuit 35 and an input of the OR circuit 38. In this embodiment a voltage of the reference voltage source 34b is set to a value corresponding to an output voltage or the temperature sensor 21 obtained at the time of a chip temperature in the power semiconductor element 20 reaching 175° C. Accordingly, when the chip temperature in the power semiconductor element 20 exceeds 175° C., the comparator 34a outputs an H-level overheat detection signal OH. Furthermore, the chip temperature detection circuit 34 includes a power source 34c and supplies power to the temperature sensor 21.

The temperature warning detection circuit 39 includes a comparator 39a and a reference voltage source 39b. An inverting input of the comparator 39a is connected to the output of the temperature sensor 21 and a non-inverting input of the comparator 39a is connected to the reference voltage source 39b. An output of the comparator 39a is connected to an input of a pulse generation circuit 49. In this embodiment a voltage of the reference voltage source 39b is set to a value corresponding to an output voltage of the temperature sensor 21 obtained at the time of the chip temperature in the power semiconductor element 20 reaching 150° C. which is lower than 175° C. Accordingly, when the chip temperature in the power semiconductor element 20 becomes equal to or higher than 150° C., the comparator 39a outputs an H-level temperature warning detection signal OHW.

The OR circuit 38 is a protection circuit. When the OR circuit 38 receives the voltage fall detection signal LV from the control voltage fall detection circuit 32, the overcurrent detection signal OC from the overcurrent detection circuit 33, or the overheat detection signal OH from the chip temperature detection circuit 34, the OR circuit 38 outputs an H-level drive stop signal to the gate control circuit 31. When the gate control circuit 31 receives the H-level drive stop signal, the gate control circuit 31 stops the operation of the power semiconductor element 20.

When the alarm signal generation circuit 35 receives the voltage fall detection signal LV from the control voltage fall detection circuit 32, the overcurrent detection signal OC from the overcurrent detection circuit 33, or the overheat detection signal OH from the chip temperature detection circuit 34, the alarm signal generation circuit 35 generates an alarm signal ALM which the alarm signal generation circuit 35 outputs only for a constant period. This alarm signal ALM is a single pulse having a pulse width which changes according to alarm factors. In this embodiment, the alarm signal generation circuit 35 generates an alarm signal ALM having a pulse width of 2 ms when the alarm signal generation circuit 35 receives the overcurrent detection signal OC. The alarm signal generation circuit 35 generates an alarm signal ALM having a pulse width of 4 ms when the alarm signal generation circuit 35 receives the voltage fall detection signal LV. The alarm signal generation circuit 35 generates an alarm signal ALM having a pulse width of 8 ms when the alarm signal generation circuit 35 receives the overheat detection signal OH.

The pulse generation circuit 49 receives the alarm signal ALM from the alarm signal generation circuit 35 and the temperature warning detection signal OHW from the temperature warning detection circuit 39. When the alarm signal ALM is not inputted and the temperature warning detection signal OHW is inputted, the pulse generation circuit 49 generates a warning signal WNG. The warning signal WNG is made up of successive pulses each having a pulse width smaller than the lower limit value of a pulse width of the alarm signal ALM, that is to say, 2 ms. In this embodiment a pulse width of the warning signal WNG is 1 ms.

An output of the alarm signal generation circuit 35 and an output of the pulse generation circuit 49 are connected to inputs of the OR circuit 50 and an output of the OR circuit 50 is connected to a gate of the MOSFET 36a. A drain of the MOSFET 36a is connected to the constant-current circuit 37a and the alarm signal output terminal 43a. A source of the MOSFET 36a is connected to a ground. As a result, when the alarm signal generation circuit 35 outputs an alarm signal ALM, an L-level signal is outputted to the alarm signal output terminal 43a for a constant period. Furthermore, when the pulse generation circuit 49 outputs the warning signal WNG, the successive pulses at a logic level reverse to that of the warning signal WNG are outputted to the alarm signal output terminal 43a.

A concrete example of the structure of each of the alarm signal generation circuit 35 and the pulse generation circuit 49 will now be described. FIG. 2 illustrates a concrete example of the structure of the alarm signal generation circuit 35. FIG. 3 illustrates a concrete example of the structure of the pulse generation circuit 49.

The alarm signal generation circuit 35 generates three one-shot pulses having different pulse widths. The alarm signal generation circuit 35 generates and outputs a one-shot pulse having a pulse width corresponding to the overcurrent detection signal OC, the voltage fall detection signal LV, or the overheat detection signal OH inputted. That is to say the alarm signal generation circuit 35 includes inverter circuits INV1, INV2, INV3, INV4, and INV5, an OR circuit OR1, an AND circuit AND1, p-channel MOS transistors MP1, MP2, and MP3, an n-channel MOS transistor MN1, constant-current sources CC1, CC2, and CC3, and a condenser C1.

A terminal from which the overcurrent detection signal OC is inputted is connected to an input of the inverter circuit INV1 and a first input of the OR circuit OR1. An output of the inverter circuit INV1 is connected to a gate of the MOS transistor MP1. A source of the MOS transistor MP1 is connected to a line of a power source Vdd and a drain of the MOS transistor MP1 is connected to a positive electrode terminal of the constant-current source CC1.

A terminal from which the voltage fall detection signal LV is inputted is connected to an input of the inverter circuit INV2 and a second input of the OR circuit OR1. An output of the inverter circuit INV2 is connected to a gate of the MOS transistor MP2. A source of the MOS transistor MP2 is connected to the line of the power source Vdd and a drain of the MOS transistor MP2 is connected to a positive electrode terminal of the constant-current source CC2.

A terminal from which the overheat detection signal OH is inputted is connected to an input of the inverter circuit INV3 and a third input of the OR circuit OR1. An output of the inverter circuit INV3 is connected to a gate of the MOS transistor MP3. A source of the MOS transistor MP3 is connected to the line of the power source Vdd and a drain of the MOS transistor MP3 is connected to a positive electrode terminal of the constant-current source CC3.

An output of the OR circuit OR1 is connected to an input of the inverter circuit INV4 and one input of the AND circuit AND1. An output of the inverter circuit INV4 is connected to a gate of the MOS transistor MN1. A drain of the MOS transistor MN1 is connected to negative electrode terminals of the constant-current sources CC1, CC2, and CC3, one terminal of the condenser C1, and an input of the inverter circuit INV5. A source of the MOS transistor MN1 and the other terminal of the condenser C1 are connected to the ground. An output of the inverter circuit INV5 is connected to the other input of the AND circuit AND1 and an output of the AND circuit AND1 is connected to a terminal from which the alarm signal generation circuit 35 outputs an alarm signal ALM.

The inverter circuits INV1, INV4, and INV5, the MOS transistor MP1, the MOS transistor MN1, the constant-current source CC1, the condenser C1, and the AND circuit AND1 make up a one-shot circuit which generates an alarm signal ALM at the time of an overcurrent being detected. At normal time, that is to say, when the alarm signal generation circuit 35 does not receive an H-level overcurrent detection signal OC, the OR circuit OR1 outputs an L-level signal and the inverter circuit INV4 outputs an H-level signal. Accordingly, the MOS transistor MN1 turned on. As a result, electric charges stored in the condenser C1 are discharged and a voltage between both terminals is 0 V. The inverter circuit INV5 outputs an H-level signal. Because the L-level signal outputted by the OR circuit OR1 is inputted to the one input of the AND circuit AND1, the AND circuit AND1 outputs an L-level alarm signal ALM. When the alarm signal generation circuit 35 receives an H-level overcurrent detection signal OC, H-level signals are inputted to both inputs of the AND circuit AND1. Accordingly, the AND circuit AND1 outputs an H-level alarm signal ALM. At this time, the MOS transistor MN1 is turned off and the MOS transistor MP1 is turned on. As a result, the condenser C1 is constant-current charged by the constant-current source CC1 and a charging voltage of the condenser C1 rises. When a charging voltage of the condenser C1 exceeds the threshold voltage of the inverter circuit INV5, the inverter circuit INV5 outputs an L-level signal and the AND circuit AND1 outputs an L-level alarm signal ALM. A pulse width corresponding to a period from the time when the overcurrent detection signal OC becomes an H level to the time when an output of the inverter circuit INV5 becomes an L level is determined by a constant-current value of the constant-current source CC1 and a capacitance value of the condenser C1. An adjustment is made to set a pulse width to 2 ms.

When the alarm signal generation circuit 35 receives the voltage fall detection signal LV or the overheat detection signal OH, the alarm signal generation circuit 35 generates an alarm signal ALM having a pulse width of 4 ms or 8 ms. This is the same with a case where the alarm signal generation circuit 35 receives the overcurrent detection signal OC. In order to realize these pulse widths, a constant-current value of the constant-current source CC2 is set to half of the constant-current value of the constant-current source CC1 and a constant-current value of the constant-current source CC3 is set to half of the constant-current value of the constant-current source CC2.

As illustrated in FIG. 3, the pulse generation circuit 49 includes an inverter circuit INV6, AND circuits AND2 and AND3, and an oscillator OSC1. A terminal which receives an alarm signal ALM from the alarm signal generation circuit 35 is connected to an input of the inverter circuit INV6 and an output of the inverter circuit INV6 is connected to one input of the AND circuit AND2. The other input of the AND circuit AND2 is connected to a terminal which receives the temperature warning detection signal OHW from the temperature warning detection circuit 39. An output of the AND circuit AND2 is connected to one input of the AND circuit AND3. The other input of the AND circuit AND3 is connected to an output of the oscillator OSC1. An output of the AND circuit AND3 is connected to a terminal from which the pulse generation circuit 49 outputs the warning signal WNG. The oscillator OSC1 continuously outputs a pulse signal having a pulse width (=1 ms, for example) smaller than that (=2 ms) of the overcurrent detection signal OC.

When the pulse generation circuit 49 does not receive an alarm signal ALM or the temperature warning detection signal OHW, the AND circuit AND2 outputs an L-level signal. Accordingly, the AND circuit AND3 outputs an L-level warning signal WNG. When the pulse generation circuit 49 receives an H-level alarm signal ALM, the AND circuit AND2 also outputs an L-level signal. As a result, the AND circuit AND3 outputs an L-level warning signal WNG. When the pulse generation circuit 49 receives an L-level alarm signal ALM and the temperature warning detection signal OHW is at an L level, the AND circuit AND2 outputs an L-level signal. When the pulse generation circuit 49 receives an L-level alarm signal ALM and the temperature warning detection signal OHW is at an H level, the AND circuit AND2 outputs an H-level signal. When the pulse generation circuit 49 receives an H-level temperature warning detection signal OHW, the AND circuit AND3 outputs a pulse signal of the oscillator OSC1 as the warning signal WNG.

The operation of the semiconductor device 10a performed at the time of alarm generation or warning generation will now be described.

Figure 4:
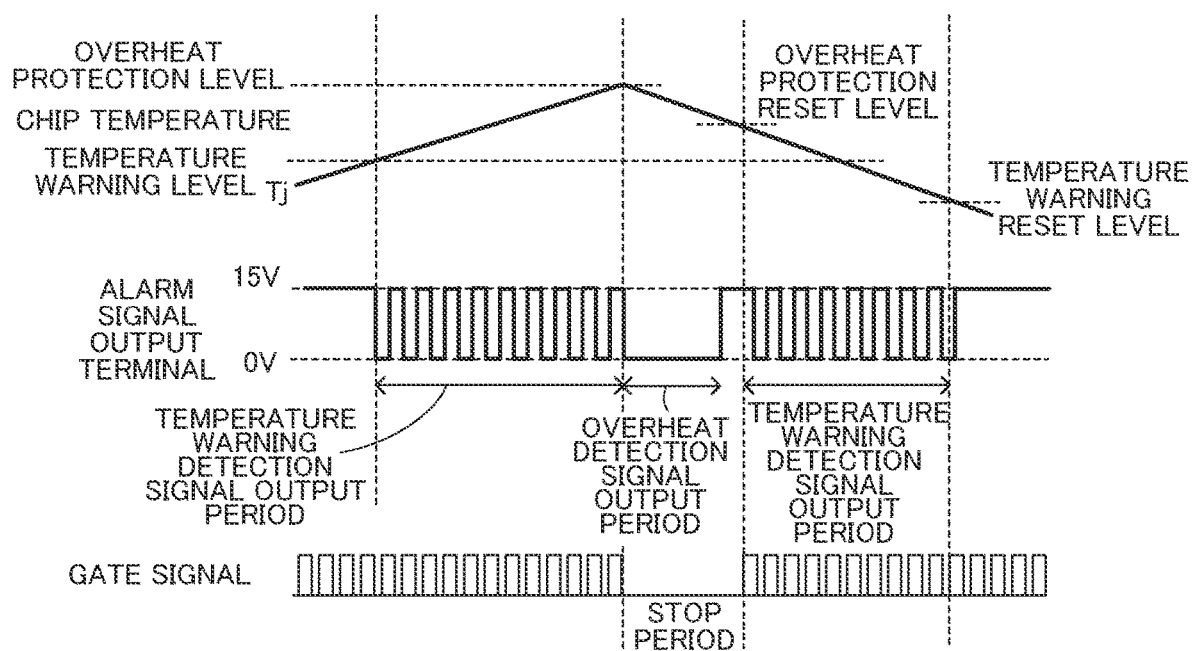
FIG. 4 is a timing chart illustrative of the overheat protection operation of the semiconductor device.
Figure 5:
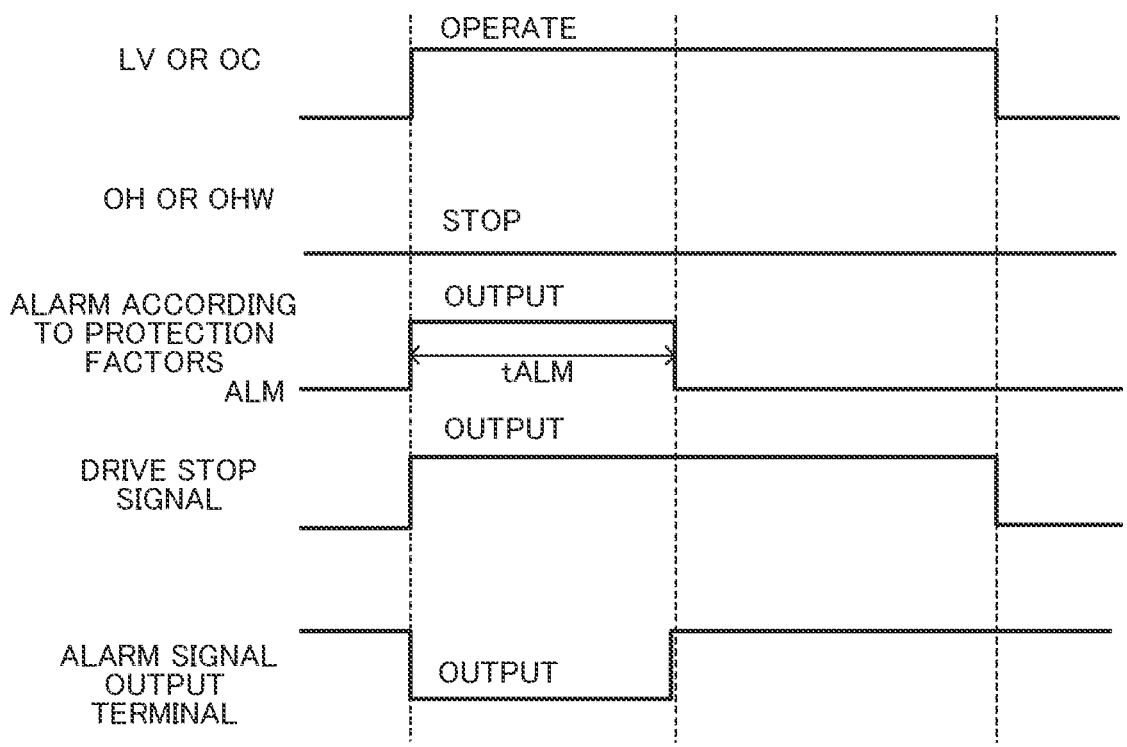
FIG. 5 is a timing chart illustrative of operation performed at the time of alarm generation.
Figure 6:
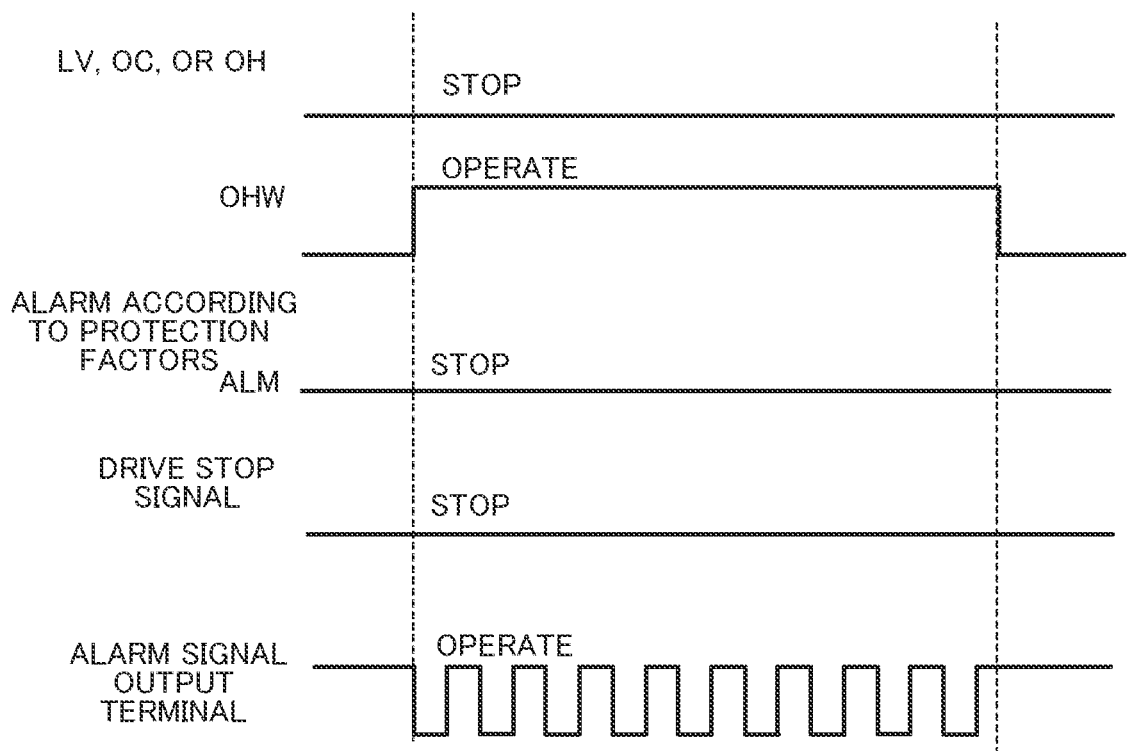
FIG. 6 is a timing chart illustrative of operation performed at the time of temperature warning generation.

FIG. 4 is a timing chart illustrative of the overheat protection operation of the semiconductor device. FIG. 5 is a timing chart illustrative of operation performed at the time of alarm generation. FIG. 6 is a timing chart illustrative of operation performed at the time of temperature warning generation.

The overheat protection operation of the semiconductor device 10a is as follows. As illustrated in FIG. 4, when chip temperature Tj in the power semiconductor element 20 rises and becomes equal to or higher than 150° C. which is a temperature warning level, the temperature warning detection circuit 39 outputs a temperature warning detection signal OHW. When the pulse generation circuit 49 receives the temperature warning detection signal OHW, the pulse generation circuit 49 generates a warning signal WNG and outputs it from the alarm signal output terminal 43a. Even when the warning signal WNG is outputted, a gate signal at normal operation time is inputted to the gate of the power semiconductor element 20. That is to say, the semiconductor device 10a operates.

When the chip temperature Tj in the power semiconductor element 20 rises further and exceeds 175° C. which is an overheat protection level, the chip temperature detection circuit 34 outputs an overheat detection signal OH. When the alarm signal generation circuit 35 receives the overheat detection signal OH, the alarm signal generation circuit 35 generates an alarm signal ALM having a pulse width of 8 ms and outputs it from the alarm signal output terminal 43a. The operation of the power semiconductor element 20 is stopped by a drive stop signal during this period.

Because the power semiconductor element 20 stops operation, the chip temperature Tj in the power semiconductor element 20 falls. When the chip temperature Tj in the power semiconductor element 20 falls below an overheat protection reset level, the chip temperature detection circuit 34 outputs an L-level overheat detection signal OH. As a result, the alarm signal generation circuit 35 stops generating the alarm signal ALM and outputs an L-level alarm signal ALM. Accordingly, the pulse generation circuit 49 generates a warning signal WNG and outputs it from the alarm signal output terminal 43a. At this time the drive stop signal becomes an L level. As a result, the power semiconductor element 20 resumes operation.

When the chip temperature Tj in the power semiconductor element 20 falls further and falls below a temperature warning reset level, the temperature warning detection circuit 39 outputs an L-level temperature warning detection signal OHW. As result, the pulse generation circuit 49 does not generate a warning signal WNG and the alarm signal output terminal 43a outputs an H-level potential indicative of a normal state.

A case where the control voltage fall detection circuit 32 detects a fall in control voltage or the overcurrent detection circuit 33 detects an overcurrent will now be described. As illustrated in FIG. 5, a voltage fall detection signal LV or an overcurrent detection signal OC becomes an H level. At this time it is assumed that the chip temperature detection circuit 34 and the temperature warning detection circuit 39 are in a stopped state in which they do not detect an abnormality in temperature. The alarm signal generation circuit 35 which receives the voltage fall detection signal LV or the overcurrent detection signal OC generates an alarm signal ALM according to protection factors. That is to say, when the alarm signal generation circuit 35 receives the voltage fall detection signal LV, the alarm signal generation circuit 35 generates an alarm signal ALM having a pulse width (tALM) of 4 ms. When the alarm signal generation circuit 35 receives the overcurrent detection signal OC, the alarm signal generation circuit 35 generates an alarm signal ALM having a pulse width (tALM) of 8 ms. While an alarm signal ALM is being generated, the alarm signal output terminal 43a outputs an L-level potential indicative of an abnormal state during a period equal to the pulse width of the alarm signal ALM. While the control voltage fall detection circuit 32 is detecting the fall in control voltage or the overcurrent detection circuit 33 is detecting the overcurrent, a drive stop signal is outputted and the power semiconductor element 20 stops operation.

A case where when the control voltage fall detection circuit 32, the overcurrent detection circuit 33, or the chip temperature detection circuit 34 does not detect an abnormality, only the temperature warning detection circuit 39 operates will now be described. As illustrated in FIG. 6, an alarm signal ALM and a drive stop signal are at an L level. Because the temperature warning detection circuit 39 outputs a temperature warning detection signal OHW, the pulse generation circuit 49 generates a warning signal WNG and the alarm signal output terminal 43a outputs successive pulses which are indicative that a temperature warning is detected.

Figure 7:
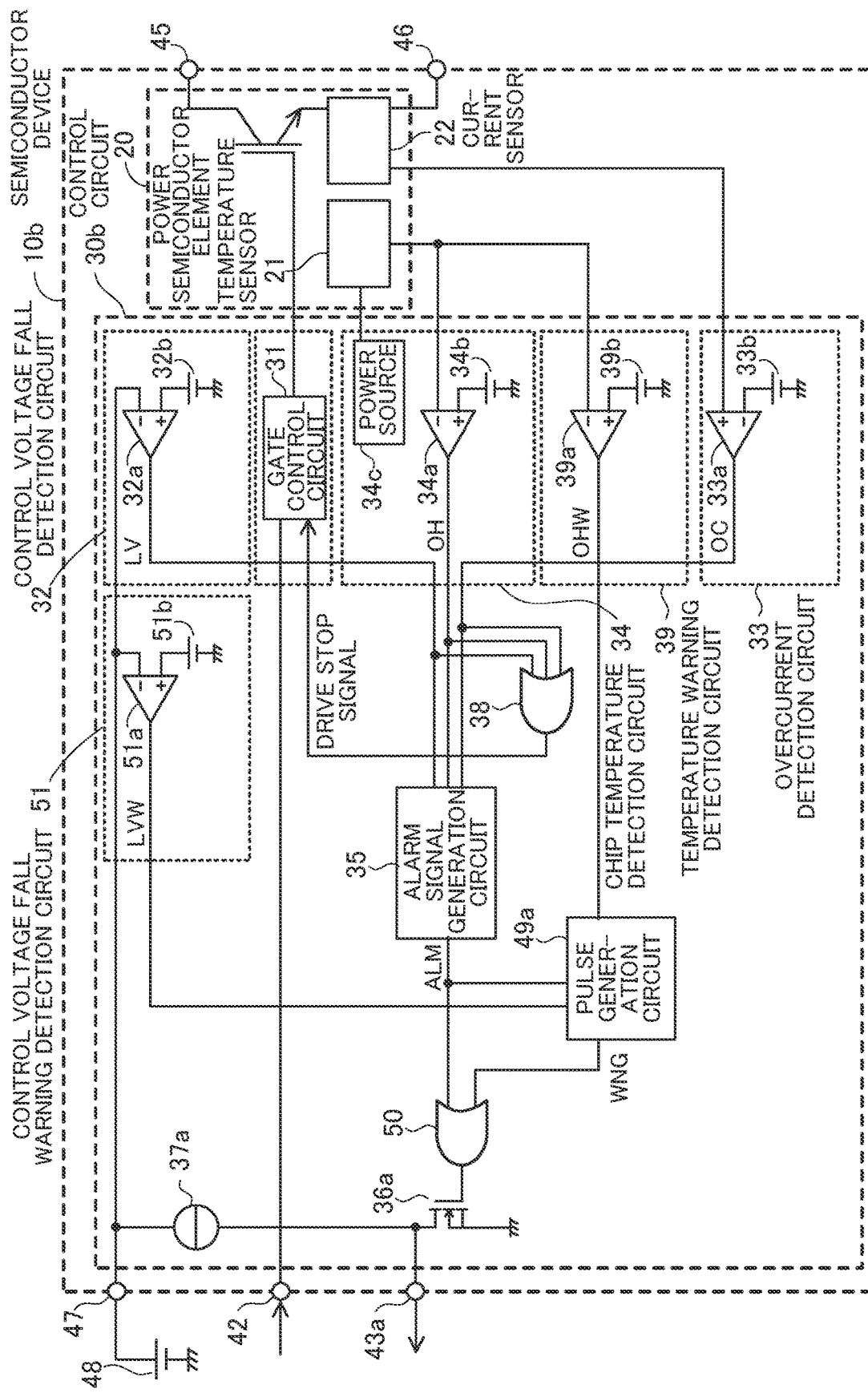
FIG. 7 is a circuit block diagram illustrative of an example of the structure of a semiconductor device according to a second embodiment.
Figure 8:
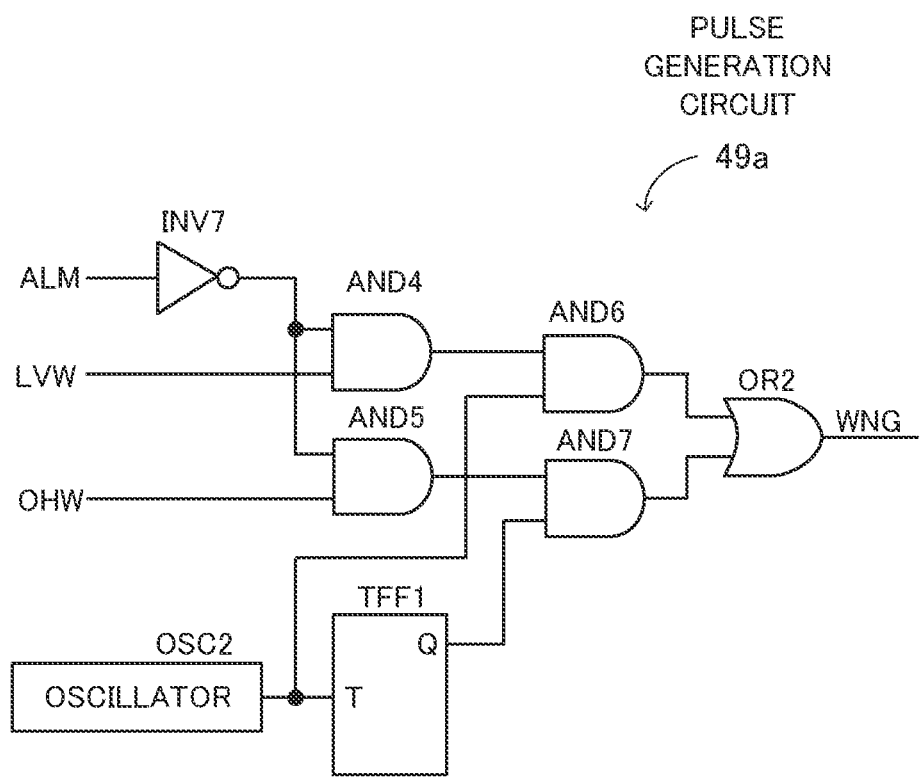
FIG. 8 is a circuit diagram illustrative of an example of the structure of a pulse generation circuit.
Figure 9:
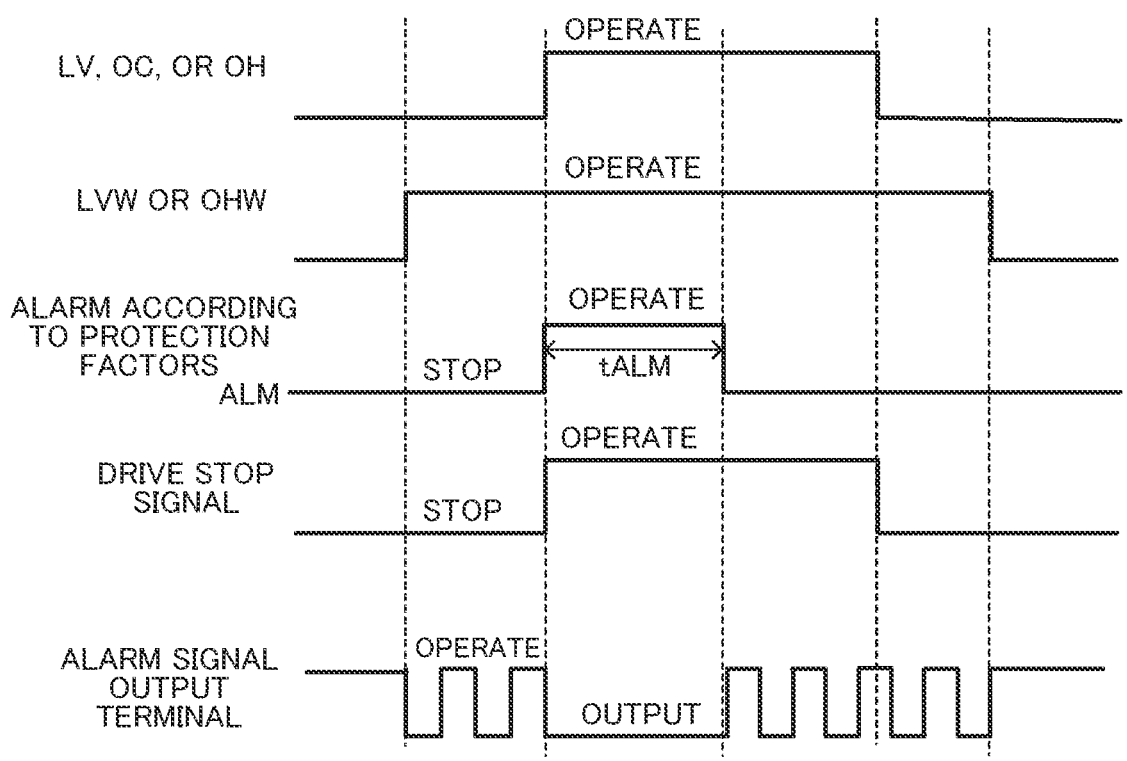
FIG. 9 is a timing chart illustrative of operation performed at the time of control voltage fall warning generation or temperature warning generation.

FIG. 7 is a circuit block diagram illustrative of an example of the structure of a semiconductor device according to a second embodiment. FIG. 8 is a circuit diagram illustrative of an example of the structure of a pulse generation circuit. FIG. 9 is a timing chart illustrative of operation performed at the time of control voltage fall warning generation or temperature warning generation.

With a control circuit 30b of a semiconductor device 10b according to a second embodiment, a control voltage fall warning detection circuit 51 is added to the control circuit 30a of the semiconductor device 10a according to the first embodiment. A pulse generation circuit 49a in the control circuit 30b receives a temperature warning detection signal OHW and a voltage fall warning signal LVW. Components in the control circuit 30b other than the control voltage fall warning detection circuit 51 and the pulse generation circuit 49a are the same as those included in the control circuit 30a of the semiconductor device 10a according to the first embodiment. Accordingly, detailed descriptions of them will not be given.

The control voltage fall warning detection circuit 51 includes a comparator 51a and a reference voltage source 51b. An inverting input of the comparator 51a is connected via a control power source terminal 47 to a control cower source 48 and a non-inverting input of the comparator 51a is connected to the reference voltage source 51b. An output of the comparator 51a is connected to an input of the pulse generation circuit 49a. In this embodiment, a voltage at normal time of the control power source 48 is set to 15 V and a voltage of the reference voltage source 51b is set to 13 V. Accordingly, when a voltage of the control power source 48 falls to or below 13 V, the comparator 51a outputs an voltage fall warning signal LVW.

The pulse generation circuit 49a receives a temperature warning detection signal OHW from a temperature warning detection circuit 39 or a voltage fall warning signal LVW from the control voltage fall warning detection circuit 51 and generates a warning signal WNG having a pulse width which changes according to factors.

A detailed description will be given. As illustrated in FIG. 8, the pulse generation circuit 49a includes an inverter circuit INV7, AND circuits AND4, AND5, AND6, and AND7, an OR circuit OR2, an oscillator OSC2, and a T flip-flop TFF1. A terminal which receives an alarm signal ALM from an alarm signal generation circuit 35 is connected to an input of the inverter circuit INV7 and an output of the inverter circuit INV7 is connected to one input of the AND circuit AND4 and one input of the AND circuit AND5. The other input of the AND circuit AND4 is connected to a terminal which receives a voltage fall warning signal LVW from the control voltage fall warning detection circuit 51. An output of the AND circuit AND4 is connected to one input of the AND circuit AND6. The other input of the AND circuit AND5 is connected to a terminal which receives a temperature warning detection signal OHW from the temperature warning detection circuit 39. An output of the AND circuit AND5 is connected to one input of the AND circuit AND7. Outputs of the AND circuits AND6 and AND7 are connected to inputs of the OR circuit OR2. An output of the OR circuit OR2 is connected to a terminal from which the pulse generation circuit 49a outputs a warning signal WNG. The other input of the AND circuit AND6 is connected to an output of the oscillator OSC2 and a T input of the T flip-flop TFF1. The other input of the AND circuit AND7 is connected to a Q output of the T flip-flop TFF1.

The oscillator OSC2 continuously outputs a pulse signal having a pulse width of 0.5 ms. The T flip-flop TFF1 generates a pulse signal having a pulse width of 1 ms from the pulse signal outputted by the oscillator OSC2.

When the pulse generation circuit 49a does not receive an alarm signal ALM, a voltage fall warning signal LVW, or a temperature warning detection signal OHW, each of the AND circuits AND4 and AND5 outputs an L-level signal. Accordingly, each of the AND circuits AND6 and AND7 also outputs an L-level signal and the OR circuit OR2 outputs an L-level warning signal WNG.

Furthermore, when the pulse generation circuit 49a receives an H-level alarm signal ALM, each of the AND circuits AND4, AND5, AND6, and AND7 outputs an L-level signal. Accordingly, the OR circuit OR2 outputs an L-level warning signal WNG.

In addition, when the pulse generation circuit 49a does not receive an H-level alarm signal ALM and receives an H-level voltage fall warning signal LVW, the AND circuit AND4 outputs an H-level signal. As a result, the AND circuit AND6 outputs the pulse signal outputted by the oscillator OSC2. Accordingly, the OR circuit OR2 outputs the pulse signal as a warning signal WNG.

Moreover, when the pulse generation circuit 49a does not receive an H-level alarm signal ALM and receives an H-level temperature warning detection signal OHW, the AND circuit AND5 outputs an H-level signal. As a result, the AND circuit AND7 outputs an output signal of the T flip-flop TFF1. Accordingly, the OR circuit OR2 outputs the output signal as a warning signal WNG.

Therefore, the pulse generation circuit 49a outputs as a warning signal WNG a signal having a pulse width which depends on whether a voltage fall warning signal LVW or a temperature warning detection signal OHW is inputted.

As has been described, with semiconductor device 10b, when a voltage of the control power source 48 falls to or below 13 V or chip temperature becomes equal to or higher than 150° C., the control voltage fall warning detection circuit 51 outputs a voltage fall warning signal LVW or the temperature warning detection circuit 39 outputs a temperature warning detection signal OHW. As illustrated in FIG. 9, while the voltage fall warning signal LVW or the temperature warning detection signal OHW is being outputted, successive pulse signals are outputted as a warning signal WNG to an alarm signal output terminal 43a.

When a fall in control voltage, a chip overheat, or an overcurrent arises while the successive pulse signals are being outputted as a warning signal WNG, an alarm signal ALM having a pulse width (tALM) which changes according to protection factors is outputted and an L-level signal is outputted to the alarm signal output terminal 43a. While a fall in control voltage, a chip overheat, or an overcurrent is arising, drive stop signal is outputted and the operation of a power semiconductor element 20 is stopped.

Figure 10:
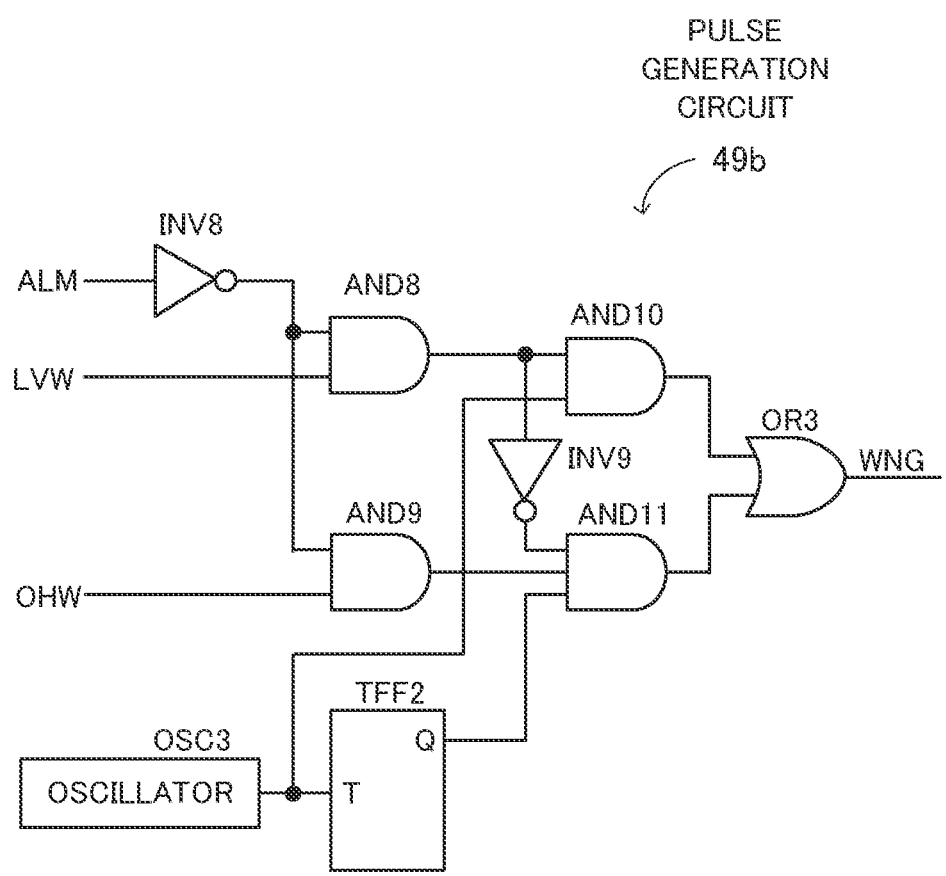
FIG. 10 is a circuit diagram illustrative of a modification of the pulse generation circuit of the semiconductor device according to the second embodiment.
Figure 11:
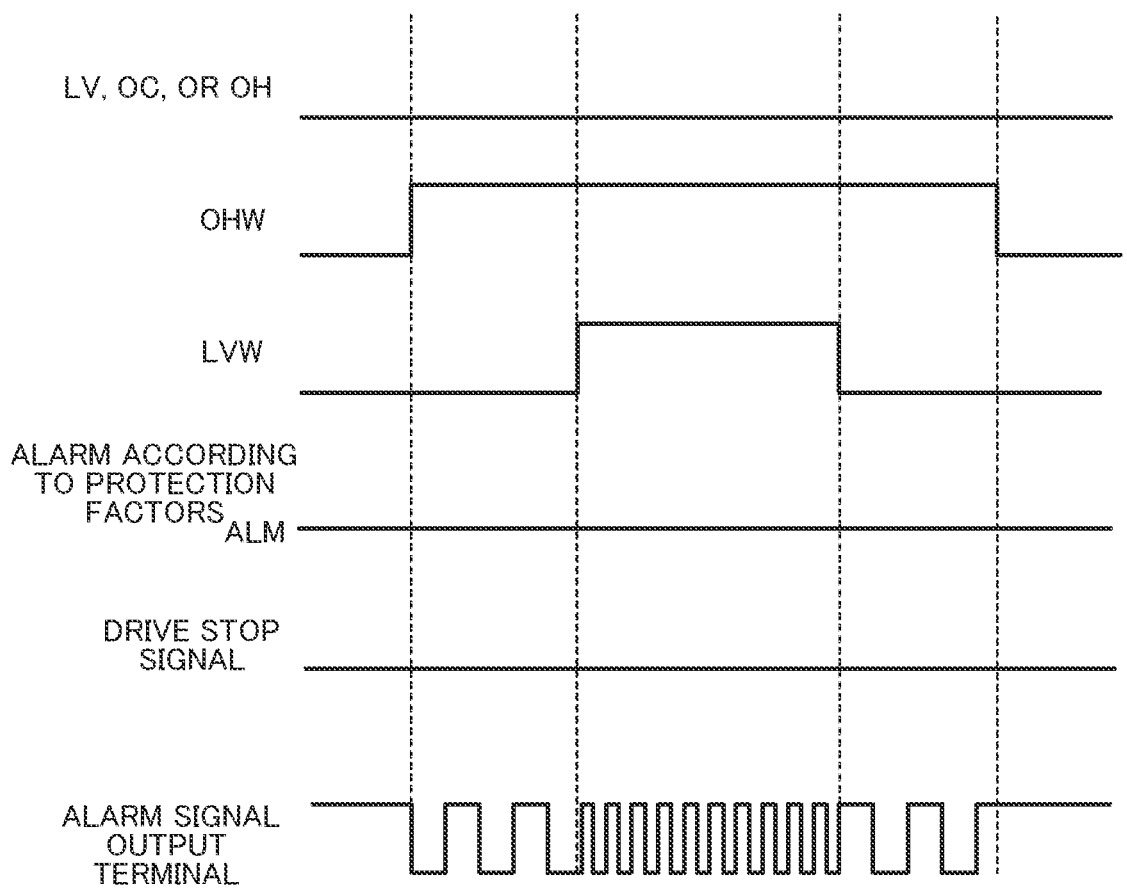
FIG. 11 is a timing chart illustrative of operation performed at the time of simultaneous generation of a control voltage fall warning and a temperature warning.

FIG. 10 is a circuit diagram illustrative of a modification of the pulse generation circuit of the semiconductor device according to the second embodiment. FIG. 11 is a timing chart illustrative of operation performed at the time of simultaneous generation of a control voltage fall warning and a temperature warning.

In the second embodiment a case where one of the temperature warning detection circuit 39 and the control voltage fall warning detection circuit 51 operates is described. In this modification a case where the temperature warning detection circuit 39 and the control voltage fall warning detection circuit 51 operate at the same time will be described. In this modification case where while the temperature warning detection circuit 39 is operating, the control voltage fall warning detection circuit 51 operates is taken as an example.

In this modification, as illustrated in FIG. 10, a pulse generation circuit 49b includes inverter circuits INV8 and INV9, AND circuits AND8, AND9, AND10, and AND11, an OR circuit OR3, an oscillator OSC3, and a T flip-flop TFF2. A terminal which receives an alarm signal ALM from the alarm signal generation circuit 35 is connected to an input of the inverter circuit INV8 and an output of the inverter circuit INV8 is connected to one input of the AND circuit AND8 and one input of the AND circuit AND9. The other input of the AND circuit AND8 is connected to a terminal which receives a voltage fall warning signal LVW from the control voltage fall warning detection circuit 51. An output of the AND circuit AND8 is connected to one input of the AND circuit AND10 and an input of the inverter circuit INV9. The other input of the AND circuit AND9 is connected to a terminal which receives a temperature warning detection signal OHW from the temperature warning detection circuit 39. An output of the AND circuit AND9 is connected to a second input of the AND circuit AND11. The other input of the AND circuit AND10 is connected to an output of the oscillator OSC3 and a T input of the T flip-flop TFF2. A first input of the AND circuit AND11 is connected to an output of the inverter circuit INV9 and a third input of the AND circuit AND11 is connected to a Q output of the T flip-flop TFF2.

The oscillator OSC3 continuously outputs a pulse signal having a pulse width of 0.5 ms. The T flip-flop TFF2 generates a pulse signal having a pulse width of 1 ms by frequency dividing the pulse signal outputted by the oscillator OSC3.

When an alarm signal ALM, a voltage fall warning signal LVW, or a temperature warning detection signal OHW is not inputted and a temperature warning detection signal OHW is inputted, the pulse generation circuit 49b performs the same operation as the pulse generation circuit 49a performs. That is to say, when a voltage fall warning signal LVW is not inputted to the pulse generation circuit 49b, an output of the AND circuit AND8 is at an L level. The L level is logic-inverted by the inverter circuit INV9 and is inputted to the first input of the AND circuit AND11. Accordingly, the AND circuit AND11 goes into a state which is the same as that of the pulse generation circuit 49a that arises when only a temperature warning detection signal OHW is inputted. As a result, the pulse generation circuit 49b outputs a warning signal WNG having a pulse width of 1 ms. As illustrated in FIG. 11, a signal obtained by phase-inverting the warning signal WNG is outputted from the alarm signal output terminal 43a.

Furthermore, when a voltage fall warning signal LVW is inputted while a temperature warning detection signal OHW is being inputted, an output of the AND circuit AND8 becomes an H level and an input of the pulse signal from the oscillator OSC3 to the AND circuit AND10 becomes valid. As a result, the OR circuit OR3 outputs a warning signal WNG having a pulse width of 0.5 ms. On the other hand, an L-level signal outputted by the inverter circuit INV9 is inputted to the first input of the AND circuit AND11. Accordingly, an input of the pulse signal from the T flip-flop TFF2 is prohibited. As a result, as illustrated in FIG. 11, a signal outputted by the AND circuit AND10 is preferentially outputted as a warning signal WNG outputted from the OR circuit OR3.

As has been described, when a voltage fall warning signal LVW alone or a temperature warning detection signal OHW alone is inputted to the pulse generation circuit 49b, the pulse generation circuit 49b outputs a warning signal WNG having a pulse width corresponding to each signal. Furthermore, when a voltage fall warning signal LVW and a temperature warning detection signal OHW are inputted to the pulse generation circuit 49b at the same time, the pulse generation circuit 49b outputs a warning signal WNG corresponding to the voltage fall warning signal LVW having a higher priority than the temperature warning detection signal OHW. The reason for this is that to deal with a voltage fall warning is desired more urgently than to deal with a temperature warning.

In the first embodiment a case where the temperature warning detection circuit 39 is included is taken as an example of a warning. However, the control voltage fall warning detection circuit 51 in the second embodiment may be included in place of the temperature warning detection circuit 39.

With the semiconductor device having the above structure, an alarm signal and a warning signal outputted from a common alarm signal output terminal. This suppresses an increase in the number of output terminals used for informing the outside of the alarm signal and the warning signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understand that various changes, substitutions, and alterations could be made hereto without departing from the spirit and scope of the invention.

What is claimed is:

1. A semiconductor device, comprising:
a power semiconductor element;
a control circuit including:
 a gate control circuit which drives the power semiconductor element,
 a plurality of alarm detection circuits which detect a plurality of abnormalities of the power semiconductor element, respectively,
 a protection circuit which stops the gate control circuit, responsive to detection of any of the abnormalities by any of the alarm detection circuits, to protect the power semiconductor element,
 an alarm signal generation circuit which generates an alarm signal responsive to the detection of any of the abnormalities by any of the alarm detection circuits, the alarm signal being a one-shot pulse having a pulse width thereof corresponding to the detected abnormality, such that alarm signals generated responsive to different ones of the abnormalities have different pulse widths, and
 a warning detection circuit which detects a warning at a timing earlier than a timing at which any of the abnormalities is detected by any of the alarm detection circuits, and
 a pulse generation circuit which generates a warning signal while the warning is being detected by the warning detection circuit, the warning signal including a plurality of successive pulses, each of which has a pulse width smaller than any of the pulse widths of the alarm signals; and
an alarm signal output terminal which outputs a signal based on one or both of the alarm signal and the warning signal.

2. The semiconductor device according to claim 1, wherein the pulse widths of the successive pulses in the warning signal are the same and are smaller than a preset threshold, which is lower than any of the pulse widths of the plurality of alarm signals.

3. A semiconductor device, comprising:
a power semiconductor element;
a control circuit including:
 a gate control circuit which drives the power semiconductor element,
 a plurality of alarm detection circuits which detect a plurality of abnormalities of the power semiconductor element, respectively,
 a protection circuit which stops the gate control circuit, responsive to detection of any of the abnormalities by any of the alarm detection circuits, to protect the power semiconductor element,
 an alarm signal generation circuit which generates an alarm signal responsive to the detection of any of the abnormalities by any of the alarm detection circuits, the alarm signal being a one-shot pulse having a pulse width thereof corresponding to the detected abnormality, such that alarm signals generated responsive to different ones of the abnormalities have different pulse widths, and
 a plurality of warning detection circuits which respectively detect a plurality of warnings, each at a timing earlier than a timing at which any of the abnormalities is detected by any of the alarm detection circuits, and
 a pulse generation circuit which generates a warning signal while any of the warnings is being detected by any of the warning detection circuits, the warning signal including a plurality of successive pulses that each have a same pulse width corresponding to the detected warning, such that warning signals generated responsive to different ones of the warnings have different pulse widths, each pulse width of the warning signal being smaller than any of the pulse widths of the alarm signals; and
an alarm signal output terminal which outputs a signal based on one or both of the alarm signal and the warning signal.

4. The semiconductor device according to claim 3, wherein
the plurality of warning detection circuits detect the warnings simultaneously, and
the pulse generation circuit generates the warning signal for one of warning detection circuits that is selected in accordance with a predetermined priority.

5. A semiconductor device comprising:
a power semiconductor element;
a control circuit including:
 a gate control circuit which drives the power semiconductor element,
 an alarm detection circuit which detects an abnormality of the power semiconductor element,
 a protection circuit which stops the gate control circuit, responsive to the detection of the abnormality by the alarm detection circuit, to protect the power semiconductor element,
 an alarm signal generation circuit which generates, responsive to the detection of the abnormality by the alarm detection circuit, an alarm signal that is a one-shot pulse,
 a warning detection circuit which detects a warning at a timing earlier than a timing at which the abnormality is detected by the alarm detection circuit, and
 a pulse generation circuit which generates a warning signal while the warning is being detected by the warning detection circuit, the warning signal including a plurality of successive pulses, each of which has a pulse width smaller than the pulse width of the alarm signal; and
an alarm signal output terminal which outputs a signal based on one or both of the alarm signal and the warning signal.

* * * * *